United States Patent [19]

Levin et al.

[11] Patent Number: 5,081,992
[45] Date of Patent: Jan. 21, 1992

[54] METHOD FOR CALCULATING LOCALIZED MAGNETIC RESONANCE SPECTRA FROM A SMALL NUMBER OF SPATIALLY-ENCODED SPECTROSCOPIC SIGNALS

[75] Inventors: David N. Levin; Xiaoping Hu, both of Chicago; Paul C. Lauterbur, Urbana, all of Ill.; Thomas Spraggins, Charlottesville, Va.

[73] Assignee: Siemens Medical Systems, Iselin, N.J.

[21] Appl. No.: 622,204

[22] Filed: Nov. 30, 1990

Related U.S. Application Data

[63] Continuation of Ser. No. 494,867, Mar. 14, 1990, abandoned, which is a continuation of Ser. No. 172,107, Mar. 23, 1988, abandoned.

[51] Int. Cl.$^5$ .............................................. A61B 5/055
[52] U.S. Cl. ................................ 128/653.2; 324/307; 324/309
[58] Field of Search ................... 128/653 A, 653.2; 324/300, 307, 309, 312, 316; 436/173

[56] References Cited

U.S. PATENT DOCUMENTS

| | | | |
|---|---|---|---|
| 4,585,992 | 4/1986 | Maudsley et al. | 324/309 |
| 4,697,149 | 9/1987 | Moran | 324/309 |
| 4,736,160 | 4/1988 | Sano et al. | 324/312 |
| 4,761,612 | 8/1988 | Holland et al. | 324/307 |
| 4,803,624 | 2/1989 | Pilbrow et al. | 324/316 |
| 4,812,760 | 3/1989 | Bottomley et al. | 324/309 |

Primary Examiner—Lee S. Cohen
Assistant Examiner—Krista M. Pfaffle
Attorney, Agent, or Firm—Mark H. Jay

[57] ABSTRACT

An MR imaging study precedes an MR spectroscopic study. Structural information from the imaging study is combined with MR spectra from the spectroscopic study to produce localized MR spectra.

8 Claims, 1 Drawing Sheet $Y \approx \dfrac{X}{10}$

METHOD FOR CALCULATING LOCALIZED MAGNETIC RESONANCE SPECTRA FROM A SMALL NUMBER OF SPATIALLY-ENCODED SPECTROSCOPIC SIGNALS

CROSS-REFERENCE TO RELATED APPLICATION

This is a continuation of application Ser. No. 07/494,867 filed Mar. 14, 1990 now abandoned, which is a continuation of application Ser. No. 07/172,107 filed Mar. 23, 1990 now abandoned.

BACKGROUND OF THE INVENTION

For medical applications it is advantageous to determine the magnetic resonance (MR) spectrum of a particular area or volume of a patient's body, i.e. to measure localized magnetic resonance spectra in vivo. This information is used e.g. to investigate metabolic processes and to diagnose pathologies (e.g. tumors). However, production of such in vivo spectroscopic information presently requires a comparatively large quantity of data.

For example, let it be assumed that a particular square image of a patient's body contains both muscle and tumor. If the maximum dimension of the tumor is only one-eighth as large as the length of each side of the square, at least 64 ($8^2$) phase-encoded spectroscopic signals are required by the Fourier transform spectroscopic imaging method. This is because 8 phase-encoding steps along each of the two directions are required to obtain a resolution which is fine enough to localize the tumor.

This problem becomes even more acute where a user requires a localized MR spectrum in a three-dimensional volume of interest rather than in a two-dimensional area of interest. For example, let it be assumed that a three dimensional cubic volume contains both muscle and tumor and that the dimensions of the tumor are approximately one-tenth the length of each side of the cube. In order to perform transform spectroscopic imaging, it would then be necessary to acquire data from at least 1000 ($=10^3$) phase-encoded signals. This would be time consuming and would reduce patient throughput through the MR unit.

It would be advantageous to reduce the quantity of data required to derive an MR spectrum for a particular area or volume of interest.

SUMMARY OF THE INVENTION

It is therefore one object of the invention to provide a method of producing localized MR spectra using a relatively small number of spectroscopic signals.

It is another object to provide such a method which can conveniently be implemented on existing MR equipment.

It is a further object to provide such a method which is well-suited to the clinical environment in which MR studies are actually performed.

Yet another object is, in general, to improve on known methods of this general type.

The invention proceeds from a realization that in a clinical environment, a patient is normally subjected to an MR imaging study before being subjected to MR spectroscopy. As a result, structural information (i.e. information about the position of bone, fat, muscle, etc. in the sample) is already available by the time that the spectroscopy study is performed. In accordance with the invention, the structural information which is acquired during the initial MR imaging study is used together with subsequently-acquired spectroscopic information to produce a localized MR spectrum.

In further accordance with the invention, the number of different spatially-encoded signals (i.e. the quantity of data required) is reduced by classifying the sample into a plurality of structural categories which may each be accurately treated as having a spatially homogeneous MR spectrum. For example, a particular sample may contain muscle, fat, bone marrow and a cancerous tumor. Because the muscle may be expected to have a spatially uniform MR spectrum, and so too for the other three structural categories, it is theoretically possible to produce a localized MR spectrum in vivo using only four spatially encoded spectroscopic signals, such as are produced in Fourier transform chemical shift imaging or backprojection chemical shift imaging. Where only muscle and fat are present, for example, only two signals would be required. This is because the (two-dimensional or three-dimensional) structural information about the sample has already been acquired during the imaging study and it is only necessary to determine the MR spectrum for each structural category (e.g. muscle, fat, tumor, bone marrow etc.)

BRIEF DESCRIPTION OF THE DRAWINGS

Exemplary and non-limiting preferred embodiments of the invention are discussed in connection with the single drawing, which is a schematic illustration of a sample.

DETAILED DESCRIPTION OF PREFERRED EMBODIMENTS

Figure 1:
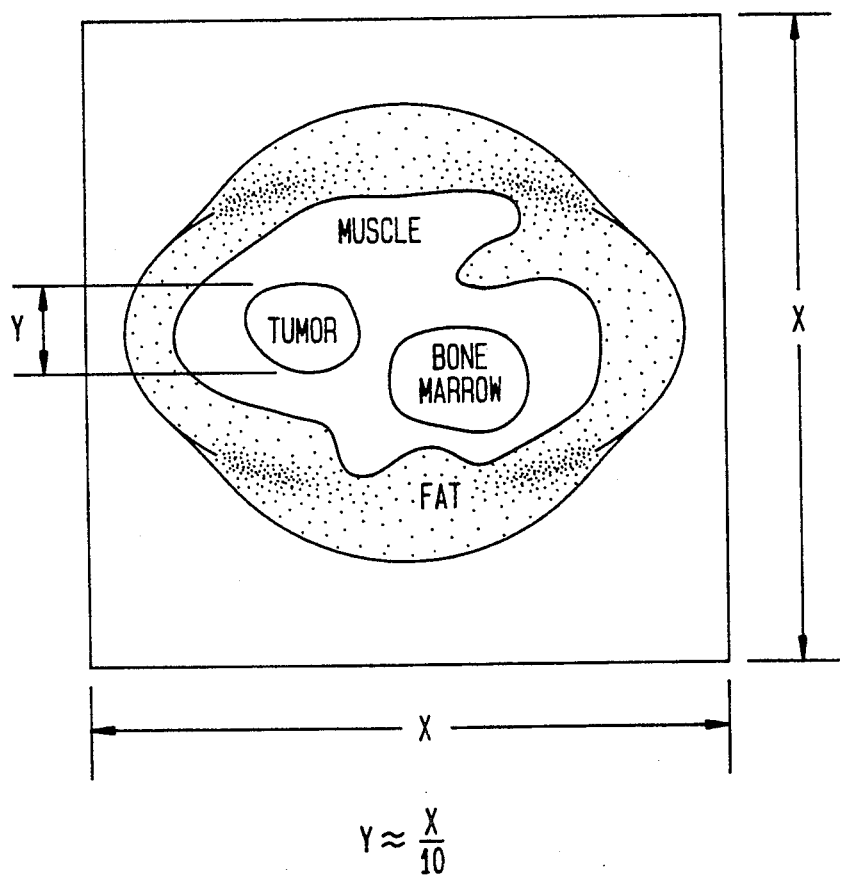

The invention may be understood at a general level by initially considering the physical situation illustrated in FIG. 1. Let it be assumed that a particular slice of a patient's body contains bone marrow, muscle, fat and a cancerous tumor which is located in the muscle. Let it also be assumed that the diameter Y of the tumor is only one-tenth the length X of the sides of the square region of interest.

Then, assuming that phase-encoded signals have half-wavelengths which are equal to and greater than Y, 100 ($=10^2$) such signals will be required to localize the MR spectrum of the tumor using conventional Fourier transform chemical shift imaging techniques. If the FIG. 1 illustration were to be extended to three dimensions, it would be clear that a thousand ($=10^3$) phase-encoded signals would be required to localize the MR spectrum of the tumor using Fourier transform chemical shift imaging.

However, in normal clinical circumstances, the structural information depicted in FIG. 1 (or in its three-dimensional equivalent) is already known because a prior MR imaging study will have produced the results illustrated in FIG. 1. Therefore, if all of the fat is considered to have a uniform MR spectrum, if all of the muscle is considered to have a uniform MR spectrum, and so forth for the bone marrow and tumor also, it follows that it is theoretically necessary to acquire only four spatially-encoded signals because the structural information to which the spectra correspond is already known.

In accordance with the preferred embodiment, the sample is classified into a plurality of structural categories, which plurality corresponds to the number of different body structures which exist in the region of interest. Then, as few as that number of spatially-coded spectroscopic signals, such as are produced in Fourier transform chemical shift imaging, are acquired.

The static and RF magnetic fields within the region/volume of interest may be considered to be homogeneous. Consequently, the phase-encoded spin-echo spectroscopic signal from the whole area/volume may be expressed as follows in terms of the spectroscopic signals which would be produced by each type of body structure in the absence of phase-encoding:

$$p_i(t) = \sum_{j=1}^{N} g_{ij} c_j(t) \quad (1)$$
$$i = 1, 2, \ldots M$$

N = number of structural categories
M = number of different phase-encoded signals acquired where $p_i(t)$ is the ith phase-encoded spectroscopic signal from the whole sample, $c_j(t)$ is the signal from the jth structural category in the absence of phase-encoding, and $$g_{ij} = \int \exp(-i\vec{k}_i \cdot \vec{r}) d^3\vec{r} \quad (2)$$
$$j^{th} \text{ STRUCTURAL CATAGORY}$$

with $k_i$ equal to the ith phase-encoding vector. Equation (1) can be expressed in a matrix form:

$$P(+) = GC(+) \quad (3)$$

where $P(t)$ and $C(t)$ are vectors with elements $p_i(t)$ and $c_j(t)$ respectively and G is an M×N matrix with elements $g_{ij}$.

A least squares fitting (LSF) technique can be applied to equation (3) in order to solve for $C(t)$ in terms of $P(t)$. Theoretically, a unique solution for $C(t)$ will be provided by LSF if the matrix has rank N. Specifically, G can be factored by means of a singular value decomposition (SVD):

$$G = L \begin{pmatrix} \lambda_1 & \ldots & O \\ & \ddots & \\ & & \\ O & \ldots & \lambda_N \\ O & \ldots & O \\ & & \\ O & \ldots & O \end{pmatrix} R \quad (4)$$

with R and L being unitary matrices and $h_j$ denoting the singular values of the G-matrix. The LSF solution is then expressed as:

$$C(t) = R^t \begin{pmatrix} \lambda_1^{-1} & \ldots & O & O & \ldots & O \\ & \ddots & & & & \\ & & & & & \\ O & \ldots & \lambda_N^{-1} & O & \ldots & O \end{pmatrix} L^t P(t) \quad (5)$$

Temporal Fourier transformation of the calculated $c_j(t)$ then provides the spectra for all the structural categories. The stability of this method depends on the magnitudes of the singular values.

The invention can also be used with electron paramagnetic resonance (EPR) apparatus or electron spin resonance (ESR) apparatus and is not limited to nuclear magnetic resonance. It is also possible to apply the invention using other types of spatially-encoded spectroscopic signals (for example, frequency-encoded spectroscopic signals like those used in back-projection algorithms for reconstruction of spectroscopic images).

The preferred embodiment appears most useful when the number of structural categories is relatively small. Advantages of the preferred embodiment are:

a) data acquisition time is reduced over that required for chemical shift imaging;

b) existing hardware can be used without hardware modification;

c) there are no restrictions on the shapes of the regions in which the spectra are measured;

d) the signal-to-noise ratio can be optimized by using low values for the phase-encoding gradient field, and e) spectra are simultaneously measured in multiple structural categories.

Those skilled in the art will understand that changes can be made in the preferred embodiments here described, and that these embodiments can be used for other purposes. Such changes and uses are within the scope of the invention, which is limited only by the claims which follow.

What is claimed is:

1. A method of producing localized MR spectra from a sample using a relatively small number of spatially-encoded MR spectroscopic signals, comprising the following separate steps:
   acquiring purely structural information about the sample using an MR imaging technique;
   subsequently acquiring spectroscopic information about the sample using a spatially-encoded MR spectroscopic technique; and
   using said structural information together with said spectroscopic information to produce MR spectra which are localized with respect to the sample.

2. The method of claim 1, wherein said spectroscopic information is in the form of phase-encoded spin-echo signals.

3. The method of claim 1, wherein the sample has a region of interest further comprising a step of classifying said region of interest into a plurality of structural categories which may each be treated as having a spatially homogeneous MR spectrum.

4. The method of claim 3, wherein said spectroscopic information acquisition step further comprises a step of using as few spatially-encoded MR spectroscopic signals as equal said plurality of structural categories as determined by said classification step.

5. The method of claim 1, wherein the sample is a part of a living subject and said acquisition steps are carried out in vivo.

6. The method of claim 1, wherein said using step comprises a step of solving, by least squares fitting, a matrix equation which contains vectors representing phase-encoded MR spectroscopic signals.

7. A method of producing localized spectra from a sample using a relatively small number of spatially-encoded spectroscopic signals, comprising the following separate steps:

acquiring purely structural information about the sample using an imaging technique;

subsequently acquiring spectroscopic information about the sample using a spectroscopic technique; and using said structural information together with said spectroscopic information to produce spectra whch are localized with respect to the sample.

8. The method of claim 7, wherein the techniques are of the electron spin resonance type.

* * * * *